(12) United States Patent
Lin et al.

(10) Patent No.: US 11,309,875 B2
(45) Date of Patent: Apr. 19, 2022

(54) FREQUENCY DOUBLER USING RECIRCULATING DELAY CIRCUIT AND METHOD THEREOF

(71) Applicant: Realtek Semiconductor Corp., Hsinchu (TW)

(72) Inventors: Chia-Liang (Leon) Lin, Fremont, CA (US); Chinchi Chang, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 8 days.

(21) Appl. No.: 17/075,754

(22) Filed: Oct. 21, 2020

(65) Prior Publication Data
US 2022/0052676 A1    Feb. 17, 2022

Related U.S. Application Data

(63) Continuation-in-part of application No. 16/992,251, filed on Aug. 13, 2020, now Pat. No. 10,998,892.

(51) Int. Cl.
*H03K 5/00* (2006.01)
*G06F 7/68* (2006.01)
*H03B 19/14* (2006.01)

(52) U.S. Cl.
CPC ........... *H03K 5/00006* (2013.01); *G06F 7/68* (2013.01); *H03B 19/14* (2013.01); *H03K 2005/00045* (2013.01); *H03K 2005/00065* (2013.01)

(58) Field of Classification Search
CPC .... G06F 7/00; G06F 7/68; H03K 5/00; H03K 5/00006; H03K 2005/00; H03K 2005/00045; H03K 2005/00065; H03B 19/00; H03B 19/10; H03B 19/14; H03B 19/16

USPC .......................................................... 327/122
See application file for complete search history.

(56) References Cited

U.S. PATENT DOCUMENTS

| 6,100,736 | A  | 8/2000  | Wu et al. |
| 6,348,821 | B1 | 2/2002  | Schwartz |
| 6,831,493 | B2 | 12/2004 | Ma |
| 8,035,430 | B2 | 10/2011 | Schnaitter |
| 8,988,121 | B2 | 3/2015  | Terrovitis |

(Continued)

FOREIGN PATENT DOCUMENTS

| CN | 103051337 A | 4/2013 |
| TW | I666871 B   | 7/2019 |

OTHER PUBLICATIONS

TW Office Action dated Sep. 10, 2021 in Taiwan application (No. 110111634).

(Continued)

*Primary Examiner* — Menatoallah Youssef
*Assistant Examiner* — Dave Mattison
(74) *Attorney, Agent, or Firm* — McClure, Qualey & Rodack, LLP

(57) ABSTRACT

A method of frequency doubling includes receiving a first clock that has a fifty percent duty cycle and is a two-phase clock having a first phase and a second phase; outputting a second clock using a multiplexer by selecting one of the first phase and the second phase of the first clock in accordance with a third clock; delaying the second clock into a fourth clock using a recirculating delay circuit; and using a divide-by-two circuit to output the third clock in accordance with the fourth clock.

20 Claims, 5 Drawing Sheets

(56) References Cited

U.S. PATENT DOCUMENTS

| | | | |
|---|---|---|---|
| 9,973,178 B1 | 5/2018 | Holzmann | |
| 10,819,322 B2 | 10/2020 | Lee et al. | |
| 2016/0329882 A1* | 11/2016 | Liu | H01L 27/11807 |
| 2020/0186155 A1* | 6/2020 | Gupta | H03L 7/18 |
| 2020/0235725 A1* | 7/2020 | Lee | H03K 7/08 |

OTHER PUBLICATIONS

TW Search Report issued in Office Action dated Sep. 10, 2021 in Taiwan application (No. 110111634).

* cited by examiner

FREQUENCY DOUBLER USING RECIRCULATING DELAY CIRCUIT AND METHOD THEREOF

CROSS-REFERENCE TO RELATED APPLICATIONS

The present application is a continuation-in-part of U.S. application Ser. No. 16/992,251, filed Aug. 13, 2020, now U.S. Pat. No. 10,998,892, the contents of which are incorporated hereby by reference.

BACKGROUND OF THE DISCLOSURE

Field of the Disclosure

The present disclosure generally relates to frequency doublers, and more specifically, to frequency doubler circuits and method having power-efficient duty cycle control.

Description of Related Art

Many modern electronic circuits require a precise clock for proper operation. A clock is a voltage signal that periodically toggles back and forth between a low level and a high level. A percentage of time that the voltage signal stays in the high level is called a duty cycle. Many circuits require a specific duty cycle for a clock to provide an optimal performance. For instance, in a multi-phase clock system wherein both a rising edge and a falling edge of a clock is used, a 50% duty cycle is usually desired.

In the co-pending application (Ser. No. 16/992,251), a frequency doubler is disclosed, wherein the frequency doubler employs a duty cycle control that utilizes a digitally control delay circuit and has a digital circuit nature and is not limited to generating a 50% duty cycle output. In the co-pending application, a digitally control delay circuit is used. What is desired, however, is an improvement on this circuit and method that realizes a further improvement in efficiency.

BRIEF DESCRIPTION OF THIS DISCLOSURE

In an embodiment, a frequency doubler is disclosed, the frequency doubler comprising: a multiplexer configured to receive a first clock and output a second clock in accordance with a third clock, wherein the first clock has a fifty percent duty cycle and is a two-phase clock comprising a first phase and a second phase; a recirculating delay circuit configured to receive the second clock and output a fourth clock and a fifth clock; and a divide-by-two circuit configured to receive the fourth clock and output the third clock, wherein the recirculating delay circuit comprises a logic gate and a delay chain comprising a plurality of clock buffers including an intermediate clock buffer and a last clock buffer, said logic gate being configured to receive the second clock and the fifth clock and output a sixth clock and said plurality of clock buffers being cascaded and configured to receive the sixth clock and output the fourth clock from the intermediate clock buffer and output the fifth clock from the last clock buffer.

In an embodiment, a method of frequency doubling is disclosed, the method comprising: receiving a first clock that has a fifty percent duty cycle and is a two-phase clock comprising a first phase and a second phase; outputting a second clock using a multiplexer by selecting one of the first phase and the second phase of the first clock in accordance with a third clock; delaying the second clock into a fourth clock using a recirculating delay circuit; and using a divide-by-two circuit to output the third clock in accordance with the fourth clock.

DETAILED DESCRIPTION OF THIS DISCLOSURE

Figure 1A:
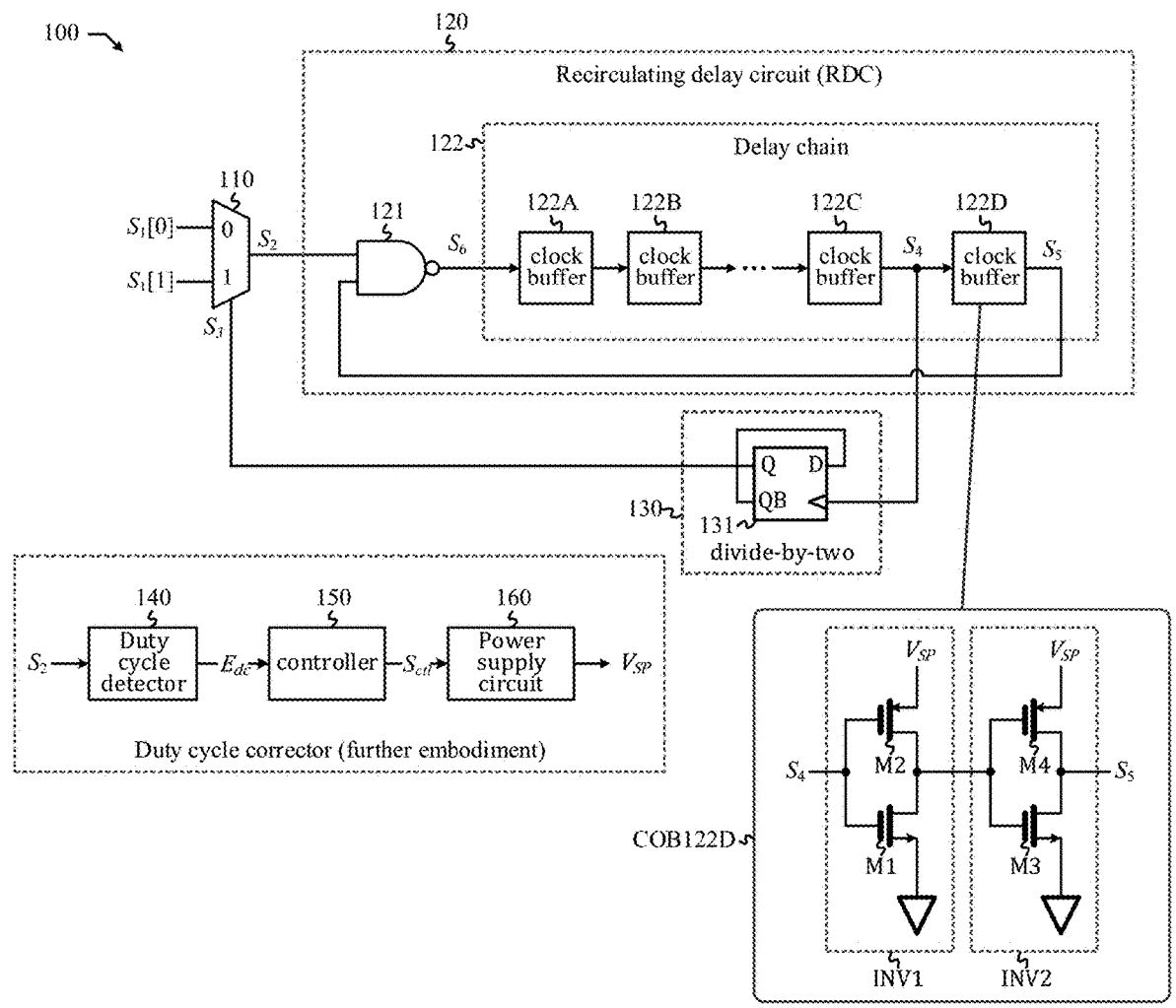
FIG. 1A shows a schematic diagram of frequency doubler in accordance with an embodiment of the present disclosure.

The present disclosure is directed to frequency doubler. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "power supply," "ground," "CMOS (complementary metal oxide semiconductor)," "NMOS (n-channel metal oxide semiconductor)," "PMOS (p-channel metal oxide semiconductor)," "resistor," "capacitor," "comparator," "transconductance amplifier," "inverter," "logical signal," "multiplexer," "switch," "data flip-flop," "logic gate," "NAND gate," "low-pass filter," "digital," "analog," and "duty cycle." Terms like these are used in a context of microelectronics, and the associated concepts are apparent to those of ordinary skills in the art and thus will not be explained in detail here.

Those of ordinary skill in the art can recognize a resistor symbol and can recognize a MOS (metal-oxide semiconductor) transistor symbol, for both PMOS transistor and NMOS transistor, and identify the "source," the "gate," and the "drain" terminals thereof. Those of ordinary skill in the art can read schematics of a circuit comprising resistors, NMOS transistors, and PMOS transistors, and do not need a verbose description about how one transistor or resistor connects with another in the schematics.

This present disclosure is disclosed in terms of an engineering sense. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

Throughout this disclosure, "$V_{DD}$" denotes a power supply node. Note that a power supply node is a node at which a voltage level is substantially stationary. In this disclosure, depending on a context that is apparent to those of ordinary skill in the art, sometimes $V_{DD}$ refers to the voltage level at the power supply node $V_{DD}$. For instance, it is apparent that when it is said that "$V_{DD}$ is 1.05V" it means that the voltage level at the power supply node $V_{DD}$ is 1.05V. A ground node is a node at which a voltage level is substantially zero.

In this present disclosure, a signal is either a voltage or a current of a variable level that can vary with time, or a number with a value that can vary with time. When a signal is a voltage, it is called a voltage signal and a level of the signal at a moment represents a state of the signal at that moment. When a signal is a number, it is called a numerical signal, also known as a digital signal, and a value of the signal at a moment represents a state of the signal at that moment.

A logical signal is a voltage signal of two states: a low state and a high state. The low state is also known as a "0" state, while the high stage is also known as a "1" state. Regarding a logical signal Q, when we say, "Q is high" or "Q is low," what we mean is "Q is in the high state" or "Q is in the low state." Likewise, when it is said that "Q is 1" or "Q is 0," what is meant is that "Q is in the 1 state" or "Q is in the 0 state."

When a logical signal toggles from low to high, it undergoes a low-to-high transition and exhibits a rising edge. When a logical signal toggles from high to low, it undergoes a high-to-low transition and exhibits a falling edge.

When a MOS transistor is used to embody a switch, it is controlled by a control signal that is a logical signal applied at a gate of the MOS transistor. A switch embodied by a NMOS transistor is in an "on" state when the control signal is high, and in an "off" state when the control signal is low.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A two-phase clock is a clock that has two phases including a first phase and a second phase, wherein the second phase is a logical inversion of the first phase and thus complementary to the first phase; when both the first phase and the second phase have a fifty percent duty cycle, the two-phase clock is said to have a fifty percent duty cycle.

A clock buffer is a circuit that receives a first clock as an input and outputs a second clock as output, wherein the second clock is substantially the same as the first clock except for a timing delay that is substantially smaller than a period of the first clock. By way of example but not limitation, the timing delay is one hundredth of the period of the first clock.

A NAND gate is a logic gate that receives a first logical signal and a second logical signal and output a third logical signal that is low if both the first logical signal and the second logical signal are high, and low otherwise. Those of ordinary skill in the art can recognize a circuit symbol of a NAND gate and understand its function without a need for explanation.

A digital word is a numerical signal of an integer value that can be embodied by a collection of a plurality of logical signals in accordance with a certain encoding scheme.

A transconductance amplifier is a circuit that receives a voltage signal and output a current signal that is proportional to the voltage signal.

A circuit is a collection of transistors, resistors, and/or other electronic devices inter-connected in a certain manner to embody or carry out a certain function.

A schematic diagram of a frequency doubler 100 in accordance with an embodiment of the present disclosure is shown in FIG. 1A. The frequency doubler 100 comprises: a multiplexer 110 configured to receive a first clock $S_1$, which has a 50% duty cycle and is a two-phase clock comprising a first phase $S_1[0]$ and a second phase $S_1[1]$, and output a second clock $S_2$ in accordance with a third clock $S_3$; a recirculating delay circuit (RDC) 120 configured to receive the second clock $S_2$ and output a fourth clock $S_4$ and a fifth clock $S_5$; and a divide-by-two circuit 130 configured to receive the fourth clock $S_4$ and output the third clock $S_3$. The RDC 120 comprises a NAND gate 121 configured to receive the second clock $S_2$ and the fifth clock $S_5$ and output a sixth clock $S_6$, and a delay chain 122 comprising a plurality of clock buffers 122A, 122B, ..., 122C, and 122D configured in a cascade topology to receive the sixth clock $S_6$ and output the fourth clock $S_4$ and the fifth clock $S_5$, wherein clock buffer 122D is a last clock buffer configured to output the fifth clock $S_5$ and clock buffer 122C is an intermediate clock buffer configured to output the fourth clock $S_4$.

For brevity, hereafter: the first clock $S_1$ is simply referred to as $S_1$; the first phase $S_1[0]$ of the first clock $S_1$ is simply referred to as $S_1[0]$; the second phase $S_1[1]$ of the first clock $S_1$ is simply referred to as $S_1[1]$; the second clock $S_2$ is simply referred to as $S_2$; the third clock $S_3$ is simply referred to as $S_3$; the fourth clock $S_4$ is simply referred to as $S_4$; the fifth clock $S_5$ is simply referred to as $S_5$; and the sixth clock $S_6$ is simply referred to as $S_6$.

In an embodiment, each of clock buffers 122A, 122B, ..., 122C, and 122D comprises two inverters cascaded to form a non-inverting buffer. As shown in call-out box COB122D, clock buffer 122D comprises two inverters INV1 and INV2 that are configured in a cascade topology to receive the fourth clock $S_4$ and output the fifth clock $S_5$ that is logically the same as $S_4$ but has a delay in timing when a toggling of state of $S_4$ occurs, i.e., a rising (falling) edge of $S_4$ will lead to a rising (falling) edge of $S_5$ with a delay in timing. Inverter INV1 comprises NMOS transistor M1 and PMOS transistor M2, while inverter INV2 comprises NMOS transistor M3 and PMOS transistor M4. Here, "$V_{SP}$" denotes a power supply node for the delay chain 122. The delay in timing of clock buffer 122D depends on a voltage level at the power supply node "$V_{SP}$": a higher (lower) voltage level leads to a shorter (longer) delay because MOS transistors react faster when the supply voltage are higher; this is clear to those of ordinary skill in the art and thus no further explanation is needed.

In an embodiment, clock buffers 122A, 122B, ..., and 122C are embodied by the same circuit as that shown in call-out box COB122D.

Multiplexer 110 outputs $S_2$ by selecting either $S_1[0]$ or $S_1[1]$ to be $S_2$ in accordance with $S_3$, and its function can be described as follows:

$$S_2 = \begin{cases} S_1[0] & \text{if } S_3 \text{ is } 0 \\ S_1[1] & \text{if } S_3 \text{ is } 1 \end{cases} \quad (1)$$

A multiplexer, such as one that can embody multiplexer 110 of FIG. 1A in accordance with equation (1), is well known in the prior art and thus not described in detail here.

RDC 120 receives $S_2$ and outputs $S_4$ and $S_5$. When $S_2$ is low, $S_6$ will be high regardless of $S_5$, and RDC 120 will stay in a halted state, wherein outputs of clock buffers 122A, 122B, and so on, including $S_4$ and $S_5$, are all high. Upon a rising edge of $S_2$, RDC 120 enters a recirculating state and stays in the recirculating state as long as $S_2$ stays high, wherein NAND gate 121 effectively behaves as an inverter (since $S_6$ will be a logical inversion of $S_5$) and NAND gate 121 and the delay chain 122 form a negative feedback loop to allow a recirculation of clock, wherein a falling edge of $S_6$ will propagate through the delay chain 121 and lead to a falling edge of $S_4$ followed by a falling edge of $S_5$, and then lead to a rising edge of $S_6$, while a rising edge of $S_6$ will propagate through the delay chain 121 and lead to a rising edge of $S_4$ followed with a rising edge of $S_5$, and then lead to a falling edge of $S_6$ if $S_2$ still stays high. This way, a delay function is fulfilled such that a rising edge of $S_2$ can trigger a rising edge of $S_4$ with a timing delay determined by a propagation delay of delay chain 122, which is an aggregate of delay in timing of all clock buffers 122A, 122B, . . . , 122C, and 122D.

Divide-by-two circuit 130 comprises a data flip-flop 131 triggered by $S_4$ and configured in a negative feedback topology to embody a divide-by-two function such that a rising edge of $S_4$ triggers $S_3$ to toggle state, resulting in either a rising edge or a falling edge of $S_3$; if one assigns a sequential number for each rising edge of $S_4$, then an even-numbered rising edge of $S_4$ triggers a toggling of $S_3$ from low to high, i.e. a rising edge of $S_3$, while an odd-numbered rising edge of $S_4$ triggers a toggling of $S_3$ from high to low, i.e. a falling edge of $S_3$; every two rising edges of $S_4$ trigger only one rising edge of $S_3$, therefore $S_3$ is said to be a divide-by-two clock of $S_4$. Data flip-flop 131 has an input pin labeled by "D," an output pin labeled by "Q," a complementary output pin labeled by "QB," and a trigger pin illustrated by a wedge and is obvious to those of ordinary skill in the art and no need for further explanation.

$S_1$ is a two-phase clock that has a 50% duty cycle. Let a period of $S_1$ be T. A purpose of the frequency doubler 100 is to make $S_2$ a clock of a double frequency. That is, a period of $S_2$ is equal to T/2, since a frequency doubling means a period halving. $S_4$ is a delay of $S_2$ and therefore also has the same period T/2. $S_3$ is a divide-by-two clock of $S_4$, and therefore a period of $S_3$ is twice of the period of $S_4$, and thus is equal to T.

Figure 1B:
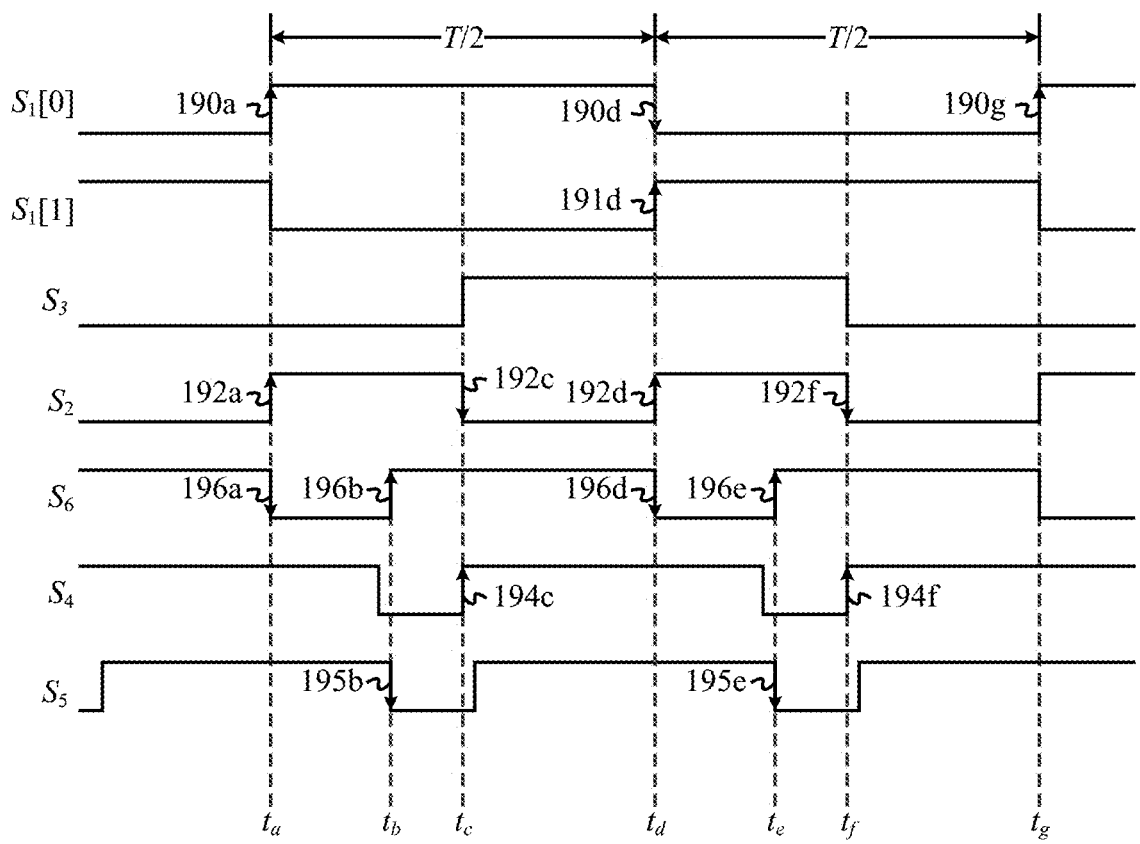
FIG. 1B shows an exemplary timing diagram of the frequency doubler of FIG. 1A.

An exemplary timing diagram of frequency doubler 100 is shown in FIG. 1B. Here, $S_1[0]$, $S_1[1]$, $S_2$, $S_3$, $S_4$, $S_5$, and $S_6$ are all clocks that are logical signals that are either high (at $V_{DD}$, $V_{SP}$, or whatever voltage level of the supply voltage) or low (at 0V). As shown, $S_1[0]$ and $S_1[1]$ are complementary. A period of $S_1[0]$ is T, as demonstrated by a time difference of T between a rising edge 190a (at time $t_a$), and a subsequent rising edge 190g (at time $t_g$). A duty cycle of $S_1[0]$ is 50%, as demonstrated by a time difference of T/2 between the rising edge 190a and a subsequent falling edge 190d (at time $t_d$), showing that $S_1[0]$ stays high for 50% of the time of a clock cycle. It is obvious that a period of $S_1[1]$ is T and a duty cycle of $S_1[1]$ is 50%. Initially, $S_1[0]$ is low, $S_1[1]$ is high, $S_3$ is low, multiplexer 110 selects $S_1[0]$ as $S_2$ and thus $S_2$ is low, consequently RDC 120 is in a halted state, wherein $S_6$, $S_4$, and $S_5$ are all high. At time $t_a$, rising edge 190a of $S_1[0]$ leads to rising edge 192a of $S_2$, causing RDC 120 to enter in a recirculation state by launching a falling edge 196a of $S_6$ (due to NAND gate 121), which propagates through delay chain 122 and results in falling edge 195b of $S_5$ at time $t_b$ and consequently rising edge 196b of $S_6$ (due to NAND gate 121), which propagates through delay chain 122 and results in rising edge 194c of $S_4$ at time $t_c$, which triggers divide-by-two circuit 130 to toggle $S_3$ to high, causing the multiplexer 110 to select $S_1[1]$ as $S_2$, resulting in a falling edge 192c of $S_2$, and consequently causing RDC 120 to enter in a halted state, wherein $S_6$, $S_4$, and $S_5$ are all high. At time $t_d$, rising edge 191d of $S_1[1]$ leads to rising edge 192d of $S_2$, causing RDC 120 to enter in a recirculation state by launching a falling edge 196d of $S_6$ (due to NAND gate 121), which propagates through delay chain 122 and results in falling edge 195e of $S_5$ at time $t_e$ and consequently rising edge 196e of $S_6$ (due to NAND gate 121), which propagates through delay chain 122 and results in rising edge 194f of $S_4$ at time $t_f$, which triggers divide-by-two circuit 130 to toggle $S_3$ to low, causing the multiplexer 110 to select $S_1[0]$ as $S_2$, resulting in a falling edge 192f of $S_2$, and consequently causing RDC 120 to enter in a halted state, wherein $S_6$, $S_4$, and $S_5$ are all high. This completes a cycle of operation, awaiting a next cycle that starts with rising edge 190g of $S_1[0]$ at time $t_g$. As a result, $S_2$ is a clock of a double frequency with a duty cycle determined by a propagation delay of RDC 120 that depends on the voltage at the power supply node $V_{SP}$.

An advantage of using a recirculating delay circuit to introduce a timing delay is efficiency due to circuit reuse. By recirculating a clock, a delay can be approximately doubled, and therefore a totally number of clock buffers can be reduced approximately by half.

In an embodiment, a voltage level at the power supply node $V_{SP}$ is fixed; this embodiment is useful in an application that does not have a strict requirement on a duty cycle of $S_2$.

In a further embodiment that includes a duty cycle corrector and is useful in an application that requires a specific and precise duty cycle of $S_2$, the frequency doubler 100 further comprises a duty cycle detector 140 configured to receive the second clock $S_2$ and output a duty cycle error signal $E_{dc}$; a controller 150 configured to receive the duty cycle error signal $E_{dc}$ and output a control signal $S_{ctl}$; and a power supply circuit 160 configured to establish a voltage level at the power supply node $V_{SP}$ in accordance with the control signal $S_{ctl}$. For brevity, hereafter the duty cycle error signal $E_{dc}$ is simply referred to as $E_{dc}$ and the control signal $S_{ctl}$ is simply referred to as $S_{ctl}$. In an embodiment, a higher (lower) value of $S_{ctl}$ leads to a higher (lower) voltage level at the power supply node $V_{SP}$ and thus causes a shorter (longer) delay of RDC 120. $E_{dc}$ represents a result of a comparison between $D_{out}$ with $D_{tgt}$, where $D_{out}$ is a duty cycle value of $S_2$ and $D_{tgt}$ is a target duty cycle value. If $E_{dc}$ indicates that $D_{out}$ is greater (smaller) than $D_{tgt}$ and needs to be decreased (increased), the controller 150 will increment (decrement) a value of $S_{ctl}$ and consequently shorten (lengthen) a delay of RDC 120 and lead to a decrement (increment) of duty cycle of $S_2$. This way, a duty cycle of $S_2$ is adjusted in a closed loop manner to make the duty cycle of $S_2$ equal to the target duty cycle.

The further embodiment can be based on either a digital control scheme or an analog control scheme. A digital control scheme will be presented first, followed by an analog control scheme.

In an embodiment in accordance with a digital control scheme, $E_{dc}$ is a logical signal, and duty cycle detector 140 outputs $E_{dc}$ in accordance with the following equation:

$$E_{dc} = \begin{cases} 1 & \text{if } D_{out} > D_{tgt} \\ 0 & \text{otherwise} \end{cases} \quad (2)$$

When $E_{dc}$ is 1, it indicates the duty cycle of $S_2$ is larger than the target duty cycle value $D_{tgt}$ and thus needs to be decreased. When $E_{dc}$ is 0, it indicates the duty cycle of $S_2$ is smaller than the target duty cycle value $D_{tgt}$ and thus needs to be increased.

In an embodiment in accordance with a digital control scheme, $S_{ctl}$ is an integer, and a greater value of $S_{ctl}$ leads to a smaller propagation delay of RDC 120. In an embodiment, the controller 150 periodically updates a value of $S_{ctl}$ in accordance with:

$$S_{ctl}^{(new)} = \begin{cases} S_{ctl}^{(old)} + 1 & \text{if } E_{dc} = 1 \\ S_{ctl}^{(old)} - 1 & \text{if } E_{dc} = 0 \end{cases} \quad (3)$$

Here, $S_{ctl}^{(old)}$ denotes an old value of $S_{ctl}$ before an update, while $S_{ctl}^{(new)}$ denotes a new value of $S_{ctl}$ after the update. When the duty cycle of $S_2$ is too large (i.e. $D_{out} > D_{tgt}$), $E_{dc}$ is 1, the controller 150 increments the value of $S_{ctl}$, leading to a smaller propagation delay of RDC 120 and thus decreasing the duty cycle of $S_2$; when the duty cycle of $S_2$ is too small (i.e. $D_{out} < D_{tgt}$), $E_{dc}$ is 0, the controller 150 decrements the value of $S_{ctl}$, leading to a larger propagation delay of RDC 120 and thus increasing the duty cycle of $S_2$.

Note that equation (3) describes an integrator function, wherein $S_{ctl}$ is an integration of $E_{dc}$, provided a level represented by the second state of $E_{dc}$ ($E_{dc}$=0) is an inversion of a level represented by the first state of $E_{dc}$ ($E_{dc}$=1).

Figure 2A:
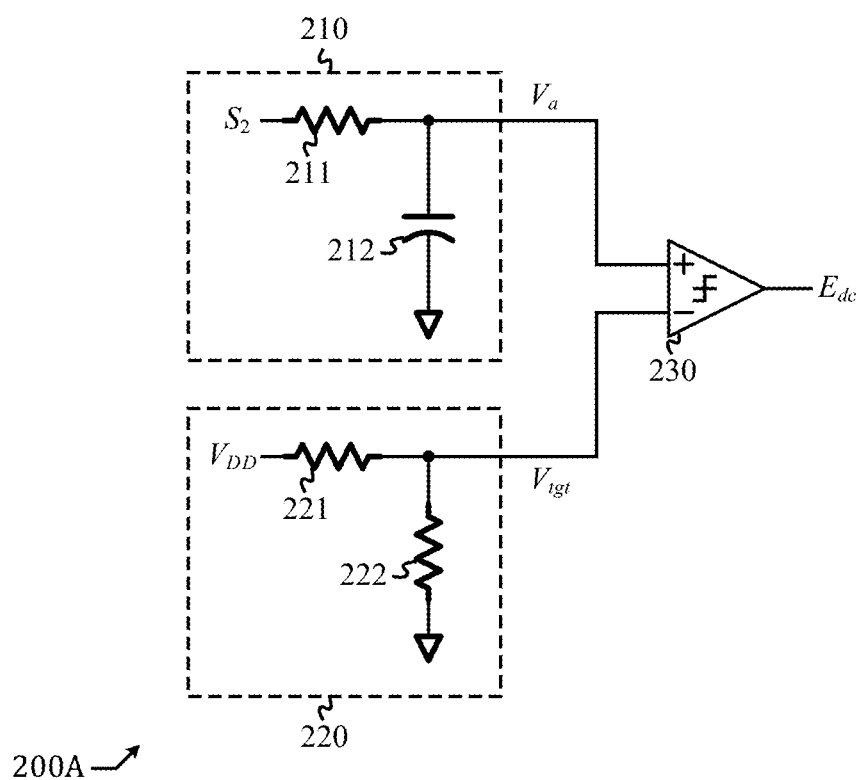
FIG. 2A shows a schematic diagram of a duty cycle detector.

A schematic diagram of a duty cycle detection circuit 200A that can be used to embody duty cycle detector 140 in accordance with a digital control scheme is shown in FIG. 2A. Duty cycle detection circuit 200A comprises a low-pass filter 210 comprising resistor 211 and capacitor 212, a resistive voltage divider 220 comprising resistor 221 and resistor 222, and a comparator 230. Low-pass filter 210 receives $S_2$ and output an average voltage $V_a$ that is approximately $D_{out}V_{DD}$, wherein $V_{DD}$ is a power supply voltage for $S_2$ and thus a voltage level of $S_2$ when $S_2$ is high. For instance, if the duty cycle of $S_2$ is 40%, $V_a$ will be approximately $0.4 \cdot V_{DD}$, since $S_2$ stays high at $V_{DD}$ for 40% of the time. Resistive voltage divider 220 outputs a target voltage $V_{tgt}$ that presents $D_{tgt}$, the target duty cycle value for $S_2$. Let resistances of resistor 221 and resistor 222 be $R_{221}$ and $R_{222}$, respectively. $R_{221}$ is chosen in accordance with $$R_{221} = R_{222} \cdot \left(\frac{1}{D_{tgt}} - 1\right) \quad (4)$$

The target voltage $V_{tgt}$ is established in accordance with a voltage division of $V_{DD}$ across resistors 221 and 222, i.e.

$$V_{tgt} = \frac{R_{222}}{R_{221} + R_{222}} \cdot V_{DD} = D_{tgt} V_{DD} \quad (5)$$

Here, equation (4) is applied. Comparator 230 compares $V_a$ with $V_{tgt}$ and outputs $E_{dc}$, indicating whether $V_a$ is higher than $V_{tgt}$. When $V_a$ is higher (lower) than $V_{tgt}$, $E_{dc}$ is 1 (0), and it indicates $D_{out}V_{DD}$ is larger (smaller) than $D_{tgt}V_{DD}$, thus $D_{out}$ is larger (smaller) than $D_{tgt}$. When $D_{out}$ is larger (smaller) than $D_{tgt}$, $E_{dc}$ is 1 (0), controller 150 increments (decrements) the value of $S_{ctl}$, resulting in a decrement (increment) of the propagation delay of RDC 120 and the duty cycle of $S_2$. The duty cycle of $S_2$ is thus adjusted in a closed loop manner towards being equal to $D_{tgt}$.

Figure 2B:
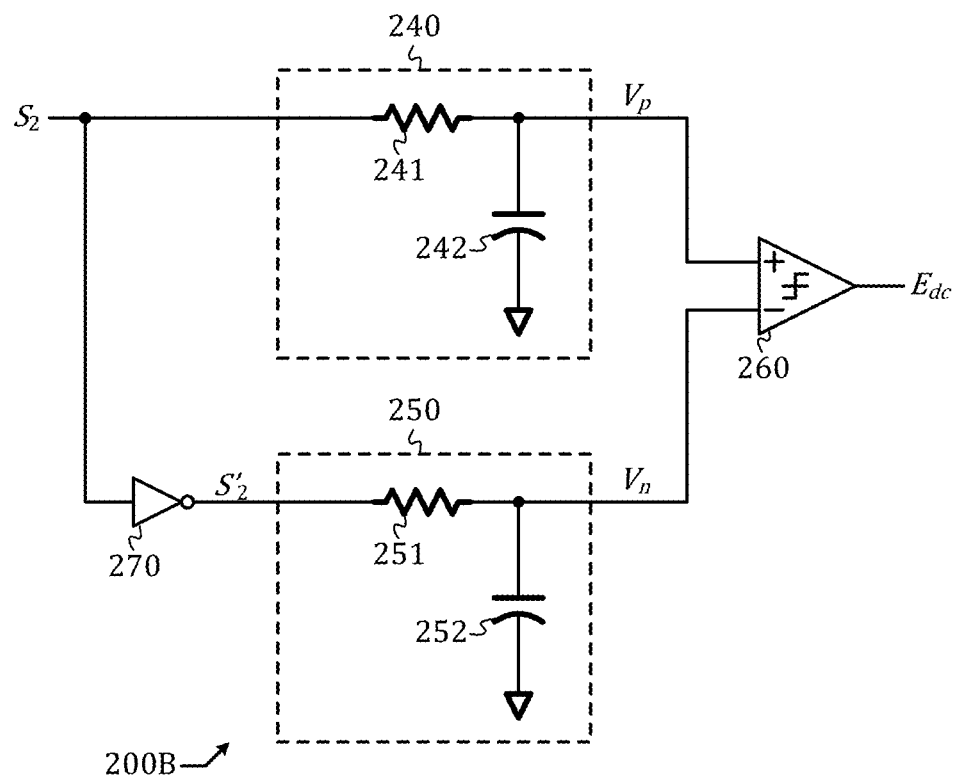
FIG. 2B shows a schematic diagram of an alternative duty cycle detector.

In a special case where the target duty cycle value $D_{tgt}$ is 50%, an alternative duty cycle detector 200B shown in FIG. 2B can be used to embody duty cycle detector 140 of FIG. 1A in accordance with a digital control scheme. Duty cycle detector 200B comprises: a first low-pass filter 240 comprising resistor 241 and capacitor 242, an inverter 270, a second low-pass filter 250 comprising resistor 251 and capacitor 252, and a comparator 260. Inverter 270 receives $S_2$ and outputs a complementary signal $S'_2$, which is a logical inversion of $S_2$. Since the duty cycle of $S_2$ is $D_{out}$, the duty cycle of $S'_2$ is $1-D_{out}$, because $S'_2$ is complementary to $S_2$. The first low-pass filter 240 receives $S_2$ and output a first average voltage $V_p$ that is approximately $D_{out}V_{DD}$. For instance, if the duty cycle of $S_2$ is 40%, $V_p$ will be approximately $0.4 \cdot V_{DD}$, since $S_2$ stays high at $V_{DD}$ for 40% of the time. The second low-pass filter 250 receives $S'_2$ and output a second average voltage $V_n$ that is approximately $(1-D_{out})V_{DD}$. For instance, if the duty cycle of $S_2$ is 40%, $V_n$ will be approximately $0.6 \cdot V_{DD}$, since $S'_2$ stays high at $V_{DD}$ for 60% of the time due to being complementary to $S_2$. Comparator 260 compares $V_p$ with $V_n$ and outputs $E_{dc}$, indicating whether $V_p$ is higher than $V_n$. When $V_p$ is higher/lower than $V_n$, $E_{dc}$ is 1 (0), it indicates that $D_{out}V_{DD}$ is larger/smaller than $(1-D_{out})V_{DD}$, thus $D_{out}$ is larger/smaller than $(1-D_{out})$, and that indicates that $D_{out}$ is larger/smaller than 50%. Therefore, duty cycle detector 200B can perform a duty cycle detection for $S_2$ if the target duty cycle value $D_{tgt}$ is 50%.

A comparator, such as comparator 230 in FIG. 2A or comparator 260 in FIG. 2B, is a circuit that receives two voltages and outputs a logical signal indicates which one of the two voltages is higher, and can be implemented using whatever circuit known in the prior art at a discretion of a circuit designer. An inverter such as inverter 270 performs a logical inversion and is well known in the prior art and thus not described in detail here.

Figure 3:
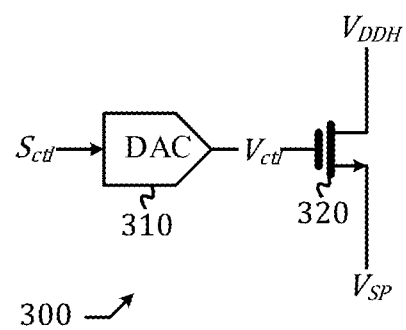
FIG. 3 shows a schematic diagram of a power supply circuit.

A schematic diagram of a power supply circuit 300 that can be used to embody power supply circuit 160 in accordance with a digital control scheme is shown in FIG. 3. Power supply circuit 300 comprises a digital-to-analog converter (DAC) 310 configured to convert $S_{ctl}$ into a control voltage $V_{ctl}$, and a NMOS transistor 320 configured as a source follower to establish a voltage level at the power supply node $V_{SP}$ in accordance with the control voltage $V_{ctl}$. Here, "$V_{DDH}$" denotes a power supply node of a voltage level that is at least 200 mV higher than a voltage level at the power supply node $V_{SP}$. Both DAC and source follower are well known in the prior art and there is no need for further explanation.

Figure 4:
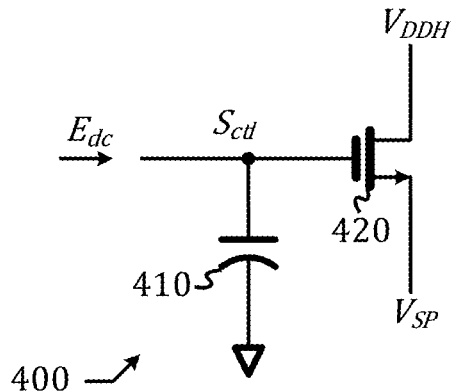
FIG. 4 shows a schematic diagram of a controller and a power supply circuit in accordance with an analog control scheme.

In an analog control scheme, $E_{ci}$ is a current signal proportional to $D_{out}-D_{tgt}$, and $S_{ctl}$ is an analog voltage signal that does not have discrete states. The duty cycle detection circuit 200A of FIG. 2A can be modified to be used in an analog control scheme by replacing the comparator 230 with a transconductance amplifier, so that $E_{dc}$ will be a current proportional to $V_a-V_{tgt}$ and consequently proportional to $D_{out}-D_{tgt}$, instead of being either logical signal of either high or low. Likewise, the duty cycle detection circuit 200B of FIG. 2B can be modified to be used in an analog control scheme by replacing the comparator 260 with a transconductance amplifier. In an analog control scheme, the controller 150 and the power supply circuit 160 can be consolidated into a control circuit 400 depicted in FIG. 4. Control circuit 400 comprises a capacitor 410 configured as a load for receiving $E_{dc}$ and establish $S_{ctl}$, and a NMOS transistor 420 configured as a source follower to establish a voltage level at the power supply node $V_{SP}$ in accordance with $S_{ctl}$. Capacitor 410 embodies an integration function that is analogous to equation (3).

Figure 5:
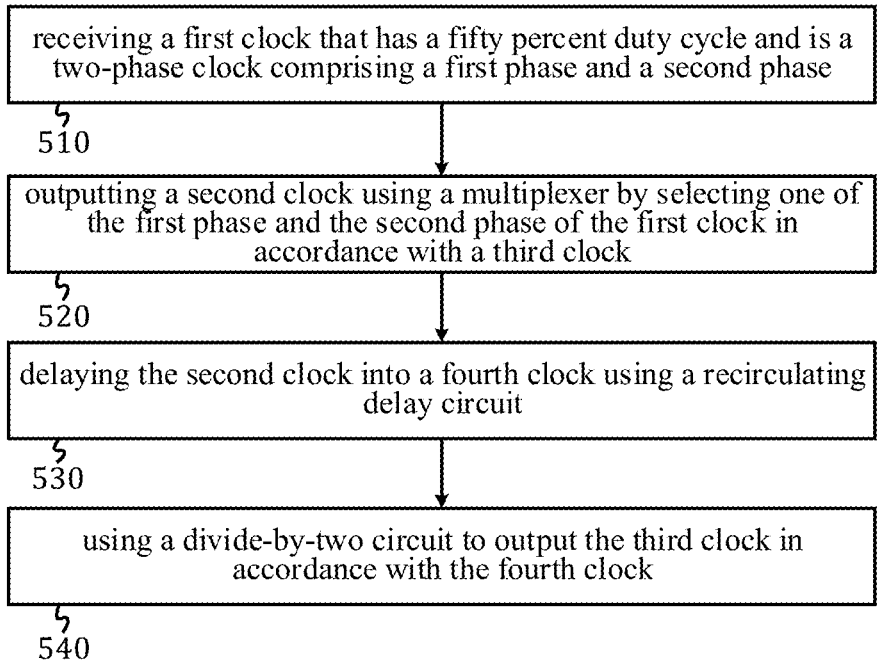
FIG. 5 shows a flow diagram of a method of frequency doubling in accordance with an embodiment of the present disclosure.

As illustrated by a flow diagram shown in FIG. 5, a method of frequency doubling comprises: (step 510) receiving a first clock that has a fifty percent duty cycle and is a two-phase clock comprising a first phase and a second phase; (step 520) outputting a second clock using a multiplexer by selecting one of the first phase and the second phase of the first clock in accordance with a third clock; (step 530) delaying the second clock into a fourth clock using a recirculating delay circuit; and (step 540) using a divide-by-two circuit to output the third clock in accordance with the fourth clock.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A frequency doubler comprising:
a multiplexer configured to receive a first clock and output a second clock in accordance with a third clock, wherein the first clock has a fifty percent duty cycle and is a two-phase clock comprising a first phase and a second phase;
a recirculating delay circuit configured to receive the second clock and output a fourth clock and a fifth clock; and
a divide-by-two circuit configured to receive the fourth clock and output the third clock, wherein the recirculating delay circuit comprises a logic gate and a delay chain comprising a plurality of clock buffers including an intermediate clock buffer and a last clock buffer, said logic gate being configured to receive the second clock and the fifth clock and output a sixth clock, said plurality of clock buffers being cascaded and configured to receive the sixth clock and output the fourth clock from the intermediate clock buffer and output the fifth clock from the last clock buffer.

2. The frequency doubler of claim 1, further including a control signal configured to control a delay of the delay chain.

3. The frequency doubler of claim 2 further comprising: a duty cycle detector configured to receive the second clock and output a duty cycle error signal, a controller configured to receive the duty cycle error signal, and a power supply circuit configured to establish a voltage level of a power supply node of the delay chain.

4. The frequency doubler of claim 3, wherein the controller is an integrator.

5. The frequency doubler of claim 4, wherein the duty cycle error is a logical signal that indicates whether a duty cycle of the second clock is higher than a target duty cycle value.

6. The frequency doubler of claim 5, wherein the control signal is a digital signal and the power supply circuit comprises a digital-to-analog converter and a source follower, the digital-to-analog converter being configured to receive the digital signal and output a control voltage, the source follower being configured to receive the control voltage and establish the voltage level of the power supply node of the delay chain.

7. The frequency doubler of claim 4, wherein the duty cycle error is a current signal proportional to a difference between a duty cycle value of the second clock and a target duty cycle value.

8. The frequency doubler of claim 7, wherein the controller comprises a capacitor configured to receive the duty cycle error signal and establish a control voltage.

9. The frequency doubler of claim 8, wherein the power supply circuit comprises a source follower configured to receive the control voltage and establish a voltage level of a power supply node of the delay chain.

10. The frequency doubler of claim 1, wherein the divide-by-two circuit comprises a data flip-flop configured in a negative feedback topology.

11. A method of frequency doubling comprising:
receiving a first clock that has a fifty percent duty cycle and is a two-phase clock comprising a first phase and a second phase;
outputting a second clock using a multiplexer by selecting one of the first phase and the second phase of the first clock in accordance with a third clock;
delaying the second clock into a fourth clock using a recirculating delay circuit; and
using a divide-by-two circuit to output the third clock in accordance with the fourth clock.

12. The method of frequency doubling of claim 11, wherein the recirculating delay circuit comprises a logic gate and a delay chain comprising a plurality of clock buffers including an intermediate clock buffer and a last clock buffer clock buffer, said logic gate being configured to receive the second clock and a fifth clock and output a sixth clock and said plurality of clock buffers being cascaded and configured to receive the sixth clock and output the fourth clock from the intermediate clock buffer and output the fifth clock from the last clock buffer.

13. The method of frequency doubling of claim 12, further comprising controlling a delay of the delay chain by a power supply circuit controlled by a control signal.

14. The method of frequency doubling of claim 13 further comprising: outputting a duty cycle error signal in accordance with a difference between a duty cycle value of the second clock and a target duty cycle value, establishing the control signal by integrating the duty cycle error signal.

15. The method of frequency doubling of claim 14, wherein the duty cycle error is a logical signal that indicates whether a duty cycle of the second clock is higher than a target duty cycle value.

16. The method of frequency doubling of claim 15, wherein the control signal is a digital signal and the power supply circuit comprises a digital-to-analog converter and a source follower, the digital-to-analog converter being configured to receive the digital signal and output a control voltage, the source follower being configured to receive the control voltage and establish a voltage level of a power supply node of the delay chain.

17. The method of frequency doubling of claim 14, wherein the duty cycle error is a current signal proportional to a difference between a duty cycle value of the second clock and a target duty cycle value.

18. The method of frequency doubling of claim 17, wherein integrating the duty cycle error signal comprises using a capacitor to integrate the control signal into a control voltage.

19. The method of frequency doubling of claim 18, wherein the power supply circuit comprises a source follower configured to receive the control voltage and establish a voltage level of a power supply node of the delay chain.

20. The method of frequency doubling of claim 11, wherein the divide-by-two circuit comprises a data flip-flop configured in a negative feedback topology.

\* \* \* \* \*